United States Patent
Kalafala et al.

(10) Patent No.: US 7,958,484 B2
(45) Date of Patent: *Jun. 7, 2011

(54) AFFINITY-BASED CLUSTERING OF VECTORS FOR PARTITIONING THE COLUMNS OF A MATRIX

(75) Inventors: Kerim Kalafala, Rhinebeck, NY (US); Vasant Rao, Fishkill, NY (US); Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 970 days.

This patent is subject to a terminal disclaimer.

(21) Appl. No.: 11/836,842

(22) Filed: Aug. 10, 2007

(65) Prior Publication Data

US 2007/0276896 A1 Nov. 29, 2007

Related U.S. Application Data

(62) Division of application No. 10/696,511, filed on Oct. 28, 2003, now Pat. No. 7,353,359.

(51) Int. Cl.
*G06F 17/50* (2006.01)
*G06F 13/00* (2006.01)
(52) U.S. Cl. .......... 716/136; 716/113; 711/173
(58) Field of Classification Search .......... None
See application file for complete search history.

(56) References Cited

U.S. PATENT DOCUMENTS

| | | | |
|---|---|---|---|
| 5,566,316 A | | 10/1996 | Fechner et al. |
| 5,764,527 A | * | 6/1998 | Nakamura ............ 716/7 |
| 6,122,628 A | | 9/2000 | Castelli et al. |
| 6,192,505 B1 | | 2/2001 | Beer et al. |
| 6,342,823 B1 | | 1/2002 | Dansky et al. |
| 6,418,401 B1 | | 7/2002 | Dansky et al. |
| 6,470,344 B1 | | 10/2002 | Kothuri et al. |
| 6,484,297 B1 | | 11/2002 | Dixit et al. |
| 6,505,207 B1 | | 1/2003 | Aggarwal et al. |
| 6,543,036 B1 | | 4/2003 | Iyer et al. |

(Continued)

OTHER PUBLICATIONS

Jess et al., "Statistical Timing for Parametric Yield Prediction of Digital Integrated Circuits," IEEE Trans. on CAD of ICs and Systems, vol. 25, No. 11, Nov. 2006, pp. 2376-2392.*

(Continued)

*Primary Examiner* — Leigh Marie Garbowski
(74) *Attorney, Agent, or Firm* — Schmeiser, Olsen & Watts; Richard M. Kotulak

(57) ABSTRACT

A method for partitioning the columns of a matrix A. The method includes providing the matrix A in a memory device of a computer system. The matrix A has n columns and m rows, wherein n is an integer of at least 3, and wherein m is an integer of at least 1. The method further includes executing an algorithm by a processor of the computer system. Executing the algorithm includes partitioning the n columns of the matrix A into a closed group of p clusters, wherein p is a positive integer of at least 2 and less than n, wherein the partitioning includes an affinity-based merging of clusters of the matrix A, and wherein each cluster is a collection of one or more columns of A.

18 Claims, 5 Drawing Sheets

U.S. PATENT DOCUMENTS

| | | | |
|---|---|---|---|
| 7,117,466 B2* | 10/2006 | Kalafala et al. | 716/6 |
| 7,222,126 B2 | 5/2007 | Wolman | |
| 7,353,359 B2 | 4/2008 | Kalafala et al. | |
| 7,428,716 B2* | 9/2008 | Visweswariah | 716/6 |
| 2003/0171900 A1 | 9/2003 | Desai | |
| 2004/0024755 A1 | 2/2004 | Rickard | |
| 2004/0024756 A1 | 2/2004 | Rickard | |
| 2004/0034633 A1 | 2/2004 | Rickard | |
| 2004/0230586 A1 | 11/2004 | Wolman | |
| 2005/0059046 A1 | 3/2005 | LaBrenz et al. | |
| 2007/0198553 A1 | 8/2007 | Wolman | |
| 2008/0140983 A1 | 6/2008 | Kalafala et al. | |

OTHER PUBLICATIONS

Visweswariah et al., "First-Order Incremental Block-Based Statistical Timing Analysis," IEEE Trans. on CAD of ICs and Systems, vol. 25, No. 10, Oct. 2006, pp. 2170-2180.*

Savkar; Random Delay Simulation; IBM Technical Disclosure Bulletin, vol. 19, No. 11; Apr. 1977; pp. 4257-4258.

Jess et al.; Statistical Timing for Parametric Yield Prediction of Digital Integrated Circuits; DAC 2003, Jun. 2-6, 2003, Anaheim, California, USA; pp. 932-937.

Li et al.; Process Variation Dimension Reduction Based on SVD; IEEE 2003; pp. IV-672-IV-675.

* cited by examiner

US 7,958,484 B2

AFFINITY-BASED CLUSTERING OF VECTORS FOR PARTITIONING THE COLUMNS OF A MATRIX

This application is a divisional of Ser. No. 10/696,511, filed Oct. 28, 2003.

BACKGROUND OF THE INVENTION

1. Technical Field

The present invention relates to a method for partitioning the columns of a matrix.

2. Related Art

Critical dimensions in microelectronic designs have been rapidly scaling to smaller and smaller values leading to increased parametric variability in digital integrated circuit performance. The resulting increase in the number of significant and independent sources of variation leads to exponential complexity for traditional static timing methodologies. One solution to this problem is path-based statistical timing analysis, in which the probability distribution of the performance of a chip is computed in a single analysis, simultaneously taking into account all sources of variation. Such probabilistic methods are often dependent on restricting the sources of variation to a small number, and several algorithms proposed in the literature have exponential complexity in the dimensionality of the process space. Thus, there is a need for a method that facilitates an efficient and simple use of statistical timing analysis in a way that takes into account the effect of all pertinent sources of variation.

SUMMARY OF THE INVENTION

The present invention provides a method of partitioning the columns of a matrix A, said method comprising:

providing the matrix A in a memory device of a computer system, said matrix A having n columns and m rows, n being an integer of at least 3, m being an integer of at least 1; and executing an algorithm by a processor of the computer system, said executing including partitioning the n columns of the matrix A into a closed group of p clusters, p being a positive integer of at least 2 and less than n, said partitioning comprising an affinity-based merging of clusters of the matrix A, each said cluster consisting of one or more columns of said matrix A.

The present invention provides a method of partitioning the columns of a matrix A, said method comprising executing an algorithm by a processor of a computer system, said executing including performing the steps of:

generating a list of clusters having n clusters such that each of the n clusters consist of a unique column of the matrix A, said matrix A being stored in a memory device of the computer system, said matrix A having n columns and m rows, n being an integer of at least 3, m being an integer of at least 1, each said cluster consisting of one or more columns of said matrix A;

determining if a termination condition is satisfied and if said determining so determines that said termination condition is satisfied then terminating said executing else performing the following steps:

selecting a next pair of clusters from the list of clusters, said next pair of clusters consisting of a first cluster and a second cluster, said next pair of clusters having an affinity that is not less than an affinity between any pair of clusters not yet selected from the list of clusters;

merging the first and second clusters to form a new cluster;

inserting the new cluster into the list of clusters while removing the first and second clusters from the list of clusters; and re-executing said determining step.

The present invention provides a computer program product, comprising a computer usable medium having a computer readable program embodied therein, said computer readable program comprising an algorithm for partitioning the columns of a matrix A, said algorithm adapted to perform the steps of:

providing the matrix A in a memory device of the computer system, said matrix A having n columns and m rows, n being an integer of at least 3, m being an integer of at least 1; and partitioning the n columns of the matrix A into a closed group of p clusters, p being a positive integer of at least 2 and less than n, said partitioning comprising an affinity-based merging of clusters of the matrix A, each said cluster consisting of one or more columns of said matrix A.

The present invention provides a computer program product, comprising a computer usable medium having a computer readable program embodied therein, said computer readable program comprising an algorithm for partitioning the columns of a matrix A, said algorithm adapted to perform the steps of:

generating a list of clusters having n clusters such that each of the n clusters is a unique column of the matrix A, said matrix A being stored in a memory device of the computer system, said matrix A having n columns and m rows, n being an integer of at least 3, m being an integer of at least 1, each said cluster consisting of one or more columns of said matrix A;

determining if a termination condition is satisfied and if said determining so determines that said termination condition is satisfied then terminating said algorithm else executing the following steps:

selecting a next pair of clusters from the list of clusters, said next pair of clusters consisting of a first cluster and a second cluster, said next pair of clusters having an affinity that is not less than an affinity between any pair of clusters not yet selected from the list of clusters;

merging the first and second clusters to form a new cluster;

inserting the new cluster into the list of clusters while removing the first and second clusters from the list of clusters; and re-executing said determining step.

The present invention advantageously facilitates an efficient and simple use of statistical timing analysis of electrical circuits in a way that takes into account the effect of all pertinent sources of variation.

DETAILED DESCRIPTION OF THE INVENTION

The present invention discloses a method for partitioning the columns of a matrix on the basis of a novel affinity measure. One application of the inventive method is reducing the number of independent variables utilized in a linear model, through a dimensionality-reduction scheme that uses a singular value decomposition (SVD) in conjunction with partitioning of the independent variables. Another application of the inventive method is that of a statistical timer which could then efficiently analyze the reduced-dimension system.

Figure 1:
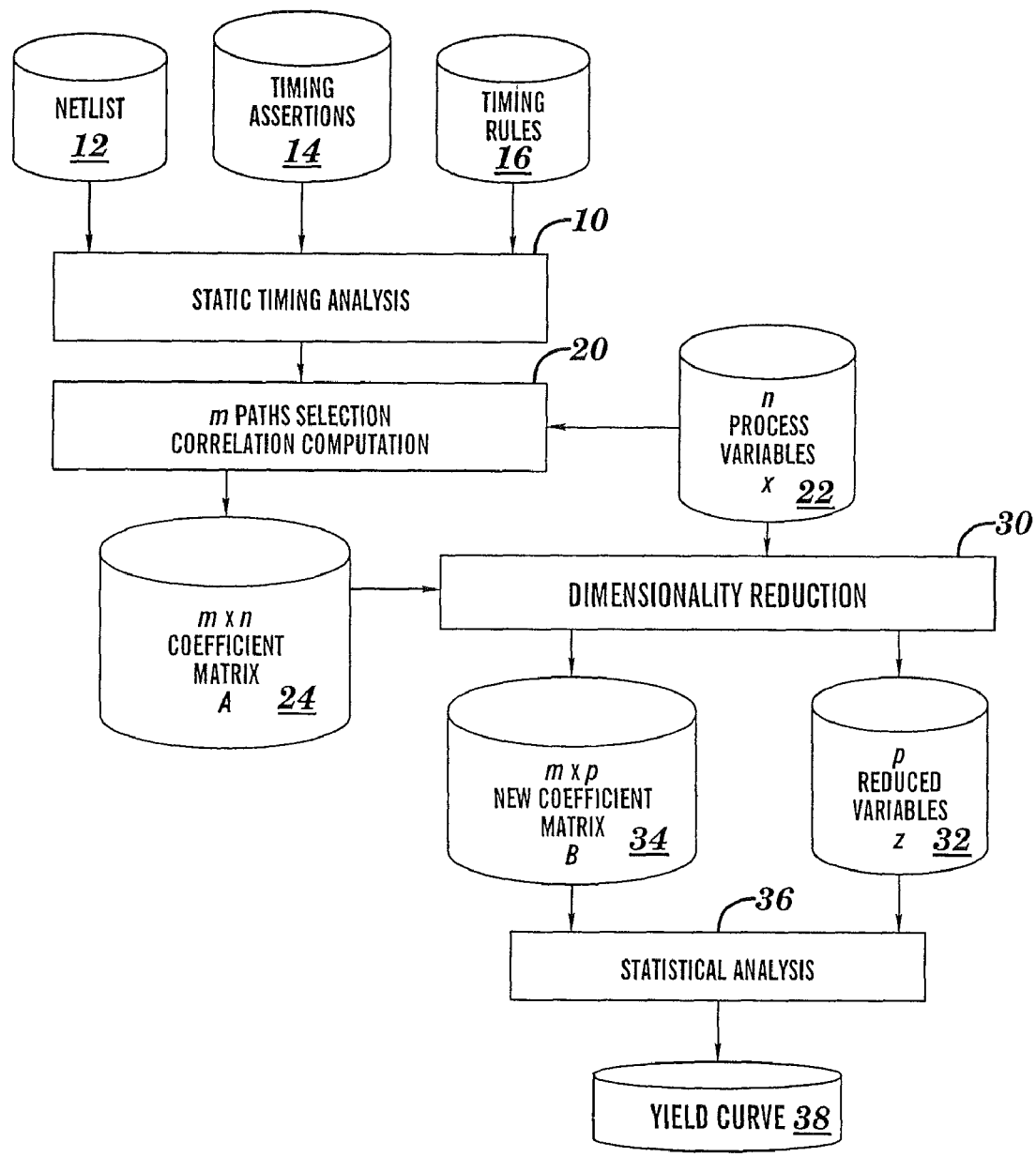
FIG. 1 is a flow chart of a path-based statistical timing method including a dimensionality reduction, in accordance with embodiments of the present invention.

FIG. 1 is a flow chart of a path-based statistical timing method in application to semiconductor chip timing, in accordance with embodiments of the present invention. A path is defined as a sequence of circuit elements through which a signal propagates. A complete path may include: the launching clock path, the data path, and the capturing clock path, so that correlations and commonalities between data and corresponding clock paths are fully captured.

A path slack is defined as the difference in time between a required arrival time (the latest or earliest time a signal must be stable in order or for the circuit to operate properly) of a signal at an end point P in the path and a calculated or actual arrival time (the latest or earliest time a signal actually becomes stable) of the signal at the point P. For sequential circuits, data arriving at a latch typically must be stable before the clock transition, and thus the path slack may be viewed as the algebraic difference between a clock path delay and a data path delay. The timing analysis method of FIG. 1 verifies the acceptability of the timing of the designed chip by confirming, for example, that the magnitude of the path delay is less than the clock cycle time so that the chip could be reliably operated. The timing analysis method calculates path slacks for each of m paths, wherein m is a positive integer. The m paths need not represent all timing paths in the chip, but may represent the m nominally most critical paths or a collection of the nominally most critical path or paths at each end point. As many paths are collected as are deemed to have a significant chance of being critical at some point in the process space.

The first input is a netlist 12, which describes the structure and topology of the circuit to be analyzed. The timing analysis method uses timing assertions 14 and timing rules 16. Examples of timing assertions 14 include, inter alia, arrival times at the inputs, required arrival times at the outputs, external loads driven by the outputs, and clock edge and phase information. Examples of timing rules 16 include, inter alia, delay models for the delay and slew (rise/fall time) of every input-to-output transition of every component of the electrical circuit. These delay models may be in the form of equations with pre-characterized coefficients, or table models or means for computing the delay models on the fly by means of simulation.

The method initially uses a well-known Static Timing Analysis 10 to calculate nominal path slacks for each of m paths, wherein m is a positive integer. The m nominal path slacks are characterized by a vector $\bar{d} \in \Re^m$ (i.e., the m-dimensional space of real numbers) and are calculated by using nominal values of the independent variables modeled.

After the Static Timing Analysis 10 is performed, the method executes an m Paths Selection Correlation Computation 20, utilizing a process variation vector x 22 (described infra). The Computation 20 may include a static timing analysis with forward propagation of nominal arrival times and backward propagation of nominal required arrival times through a timing graph representing the timing properties of the electrical circuit. It may also include a path-tracing procedure to list the nominally most critical paths, or the most critical path or paths leading up to each end point. It may also include a slack recording procedure to record the nominal slack of each such path. It may also include a sensitivity procedure to determine the sensitivity of each such path slack to each source of variation. The sensitivity procedure may traverse the path and collect sensitivities from the delay models, or may use simulation on the fly, or may employ finite differencing to determine the sensitivities.

The Static Timing Analysis 10 produces a nominal result of the timing of the circuit, whereas the present invention determines the full probability distribution of the timing of the circuit while taking into account sources of variation. With the Static Timing Analysis 10, the nominal calculated arrival time of the signal at the point P does not account for the dependence of path slack on a set of independent stochastic variables whose deviation from nominal values is described by a vector $x \in \Re^n$ (i.e., the vector x 22 of FIG. 1) of order n having elements $x_i$ (i=1, 2, . . . , n). Each independent variable $x_i$ is a random variable characterized by a probability density function (PDF), which may represent a normal probability distribution or any other form of probability distribution.

The independent variables $x_i$ may be, inter alia, process variations which may fit into some or all of the following categories: process variations (e.g., control parameters operative during processing such as focus of a lens during photolithography or dose of ions during implantation); manufacturing variations (e.g., manufacturing dimensional tolerances), operating conditions variations (e.g., operating temperature of the chip, power supply voltage); fatigue-related variations (e.g., power-on hours or product lifetime); and modeling errors (e.g., neglect or approximation of a term in a modeling equation); material property variations (e.g., electrical conductivities, capacitances, doping concentrations, etc.).

The path slack variations d of the paths are each assumed to be a linear function of the sources of variation $x_i$. Although, the assumption of linearity may represent an approximation for one or more of the variables $x_i$, the linearity approximation for any variable $x_i$ can be made increasingly accurate by decreasing the numerical range of $x_i$. The path slacks are modeled as $$\bar{d}+d=\bar{d}+Ax \qquad (1)$$

wherein $d \in \Re^m$ represents the variation of the path slacks from their nominal values and $A \in \Re^{m \times n}$ is a coefficient matrix which facilitates expression of the path slack variations d as a linear combination of the process variations x. The matrix A is identified in FIG. 1 as the coefficient matrix A 24. Scaling may be applied in a pre-processing step to obtain circular symmetry; i.e., the x variables $x_i$ can be treated, for convenience and without loss of generality, as unit-variance zero-mean independent random variables after the scaling.

The dimensionality reduction step 30 generates a new coefficient matrix B and an associated new set of p statistically independent variables in a vector z of order p, wherein p<n. The new coefficient matrix B is identified in FIG. 1 as the new coefficient matrix B 34, wherein B is an m×p matrix. The new process variable vector z, which is associated with the new coefficient matrix B, is identified in FIG. 1 as the vector z of reduced variables 32. Implementation of the dimensionality reduction step 30 will be discussed infra in conjunction with FIGS. 2-4.

Following the dimensionality reduction step 30, a statistical timing analysis 36 may be performed as described, for example, by Jess et al. (see Reference [1]). A yield curve 38 may be determined as an output of the timing analysis 36.

Various diagnostics may also be produced as an output of the timing analysis 36. The efficiency of all three methods would benefit from performing the analysis in a lower-dimensional space.

Figure 2:
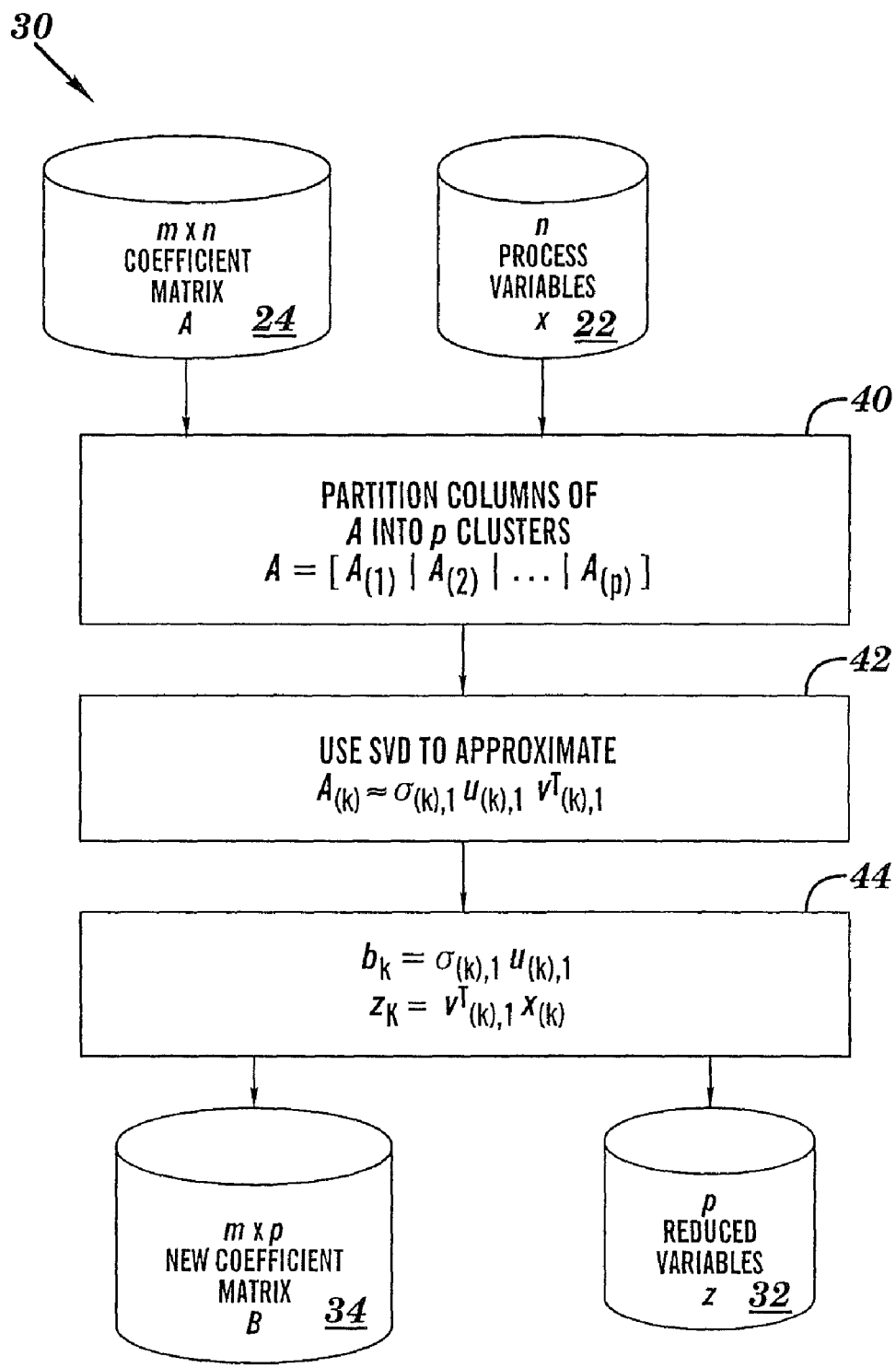
FIG. 2 is a flow chart describing the dimensionality reduction of FIG. 1 including a matrix partitioning, in accordance with embodiments of the present invention.

FIG. 2 is a flow chart describing the dimensionality reduction 30 of FIG. 1, in accordance with embodiments of the present invention. The process of FIG. 2 starts with the m×n matrix A 24 and vector x 22 of order n, and determines the m×p matrix B 34 and the vector z 32 of order p, wherein $2 \leq p \leq n$. As p/n is reduced, further dimensionality reduction is achieved. However, decreasing p relative to n increases the numerical errors of the procedure, so that a lower bound for p is controlled by a degree of accuracy desired, as will be explained infra.

The process of FIG. 2 starts with the linear model of the deviation of the path slacks from their nominal values $$d = Ax \qquad (2)$$

The number of paths m may be large (such as, inter alia, 10,000 or higher), while the number of statistically independent process variables n may be smaller (such as, inter alia, 30 to 50). The method of FIG. 2 seeks a reduction in the number of statistically independent process variables by looking for a new set of statistically independent process variables $z \in \Re^p$, where $2 \leq p \leq n$ ($n \geq 3$), such that $$\tilde{d} = Bz \qquad (3)$$

where B is the new m×p coefficient matrix, and $\tilde{d} \in \Re^m$ is the new path-slack variation vector, which is the lower-dimensionality approximation to the original vector d. The number (p) of new process variables may be small (such as, inter alia, 2 to 5). Moreover, each new process variable will be a linear combination of the old process variables. For some choices of B, however, z may not be statistically independent, especially in the case of non-Gaussian process variations. However, Li et al. (see Reference [2]) have used a technique based on Singular Value Decomposition (SVD) to find B and z such that: the new process variables z are also statistically independent, even for non-Gaussian sources of variation; and the Euclidean norm of the error $\|d - \tilde{d}\|$ is as small as possible. Li et al. have shown that statistical independence is preserved by partitioning the columns of the original coefficient matrix A into p clusters and constructing the new coefficient matrix B and the new process variables z using the (largest) singular values and corresponding (left and right) singular vectors of each of the p clusters of A in a technique referred to as SMSVD (Sub-Matrix SVD). Accordingly, step 40 of FIG. 2 partitions the columns of the coefficient matrix A into p clusters denoted as $A_{(1)}, A_{(2)}, \ldots,$ and $A_{(p)}$. The novel manner in which the coefficient matrix A is partitioned into the p clusters in accordance with the present invention is disclosed herein in accordance with FIGS. 3-4 and a description thereof.

Assuming that the coefficient matrix A has been partitioned into the p clusters (as will be described infra), let $A_{(k)}$ denote the cluster corresponding to the k-th cluster and let $x_{(k)}$ denote the corresponding sub-vector of process variables. Using SVD (see Reference [3]), step 42 of FIG. 2 approximates each cluster $A_{(k)}$ by its principal component as $$A_{(k)} \approx \sigma_{(k),1} u_{(k),1} v_{(k),1}^T \qquad (4)$$

where $\sigma_{(k),1}$ is the largest singular value, $u_{(k),1}$ is the corresponding left singular vector, and $v_{(k),1}$ is the corresponding right singular vector of the k-th cluster $A_{(k)}$. Equation (4) is the only source of approximation in the dimensionality reduction procedure relating to the SMSVD technique of Reference [2].

The k-th column of the new m×p coefficient matrix B is $$b_k = \sigma_{(k),1} u_{(k),1} \qquad (5)$$

which is the left singular vector of the cluster $A_{(k)}$ of the k-th cluster scaled by its largest singular value. The k-th new process variable $z_k$ is:

$$z_k = v_{(k),1}^T x_{(k)} \qquad (6)$$

Accordingly, step 44 of FIG. 2 determines $b_k$ and $z_k$ via Equations (5) and (6), respectively. Since $z_k$ depends only on original process variables in the k-th cluster and the different clusters are disjoint by definition, statistical independence is preserved in z, as shown in Reference [2]. Since each of these (left or right) singular vectors has a unit norm, the linear transformation (6) ensures that the z variables also have zero mean and unit variance, given that the original x variables had zero mean and unit variance, which is an added convenience.

The affinity-based clustering technique of the present invention will next be described. As remarked earlier, the only approximation in the dimensionality reduction procedure is in Equation (4). From SVD theory (See Reference [3]), it can be shown that the cluster approximation error E in the SVD approximation can be measured by $$E = \max_{k=1,2,\cdots p} \left( \frac{\sigma_{(k),2}}{\sigma_{(k),1}} \right) \qquad (7)$$

which means that for each cluster, as long as the second largest singular value $\sigma_{(k),2}$ of its cluster $A_{(k)}$ is much smaller than its largest singular value $\sigma_{(k),1}$, there will be little or no error due to the approximation of Equation (4). For any given cluster of columns of the matrix A, one can compute the approximation error by Equation (7) above. A brute-force method of trying all possible clusters and picking the best having the smaller error can be used, but is impractical for large n, since Reference [4] shows that the total number of ways to partition n objects into p clusters is given by the Stirling Number of the second kind which is exponential in n.

However, the present invention discloses an algorithm to find a good clustering of columns of A, that will result in a small error computed by Equation (7) as will be discussed next. Specifically, the novel clustering technique of the present invention exploits a novel affinity measure between two vectors, wherein the affinity is a function of the ratio of the norms of the two vectors and of a relative alignment between the two vectors. This clustering scheme is based on the pair-wise affinity between the columns of A. To this end, let w and y be any two arbitrary non-zero vectors. Assuming that $\|y\| \leq \|w\|$, the norm-ratio $\alpha$ between y and w is defined as $$\alpha = \frac{\|y\|}{\|w\|} \qquad (8)$$

and the alignment $\beta$ between y and w is defined as $$\beta = \frac{|y^T w|}{\|y\| \|w\|} \qquad (9)$$

so that the alignment $\beta$ may be interpreted as the cosine of the angle between vectors y and w. The norm $\|y\|$ is defined as the root mean square of the entries of y; i.e., if y is a vector of order n having ordered components $y_1, y_2, y_3, \ldots, y_n$, then $$\|y\|=[(y_1)^2+(y_2)^2+(y_3)^2+\ldots+(y_n)^2]^{1/2}$$

It is assumed herein that $0<\alpha\leq 1$ and it follows from the Cauchy-Schwartz inequality that $0\leq\beta\leq 1$. Also, if $\beta=0$ then the two vectors are orthogonal (i.e., the angle between y and w is either 90 or 270 degrees). If $\beta=1$, then y and w are perfectly aligned (i.e., the angle between y and w is either 0 or 180 degrees).

Next, effect of clustering y and w together is considered by defining a matrix S=[wy] with 2 columns w and y, and computing the two (largest) singular values of S. Note that the further the gap is between these two singular values, the better is the quality of clustering y in the same partition as w. Note that a "partition," a "cluster," and a "sub-matrix" each have the same meaning herein. Thus a cluster of the matrix A is defined herein, including in the claims, as a matrix that includes one or more columns of the matrix A such that no column of the matrix A appears more than once in the cluster. A group of two or more clusters of the matrix A is defined herein and in the claims to be a "closed group" of the matrix A if no two clusters in the group include a same column of the matrix A and if the group of clusters collectively include all columns of the matrix A. By the preceding definition, any column or group of columns of the matrix A is a cluster of the matrix A. Any cluster not in the closed group is said to be outside of the closed group. The present invention, however, discloses infra how to form particular clusters of the matrix A based on using an "affinity" of the columns of the matrix A, wherein said particular clusters of the matrix A are utilized in a manner that reduces or minimizes the error expressed in Equation (7).

Forming $S^TS$:

$$S^TS = \begin{bmatrix} w^Tw & w^Ty \\ y^Tw & y^Ty \end{bmatrix} = \|w\|^2 \begin{bmatrix} 1 & \pm\alpha\beta \\ \pm\alpha\beta & \alpha^2 \end{bmatrix}$$

Thus, the eigen-values of $S^TS$ are $\|w\|^2$ times the roots $\lambda_1$ and $\lambda_2$ of the characteristic polynomial derived as follows:

$$\det\begin{bmatrix} \lambda-1 & \mp\alpha\beta \\ \mp\alpha\beta & \lambda-\alpha^2 \end{bmatrix} = (\lambda-1)(\lambda-\alpha^2) - \alpha^2\beta^2$$

$$= \lambda^2 - (1+\alpha^2)\lambda + \alpha^2(1-\beta^2)$$

so that $$\lambda_{1,2} = \frac{(1+\alpha^2) \pm \sqrt{(1+\alpha^2)^2 - 4\alpha^2(1-\beta^2)}}{2}$$

But the singular values $\sigma_1(S)$ and $\sigma_2(S)$ of S are $\|w\|$ times the square-root of $\lambda_1$ and $\lambda_2$, respectively, which are:

$$\sigma_1(S)=\|w\|\sqrt{\lambda_1}, \sigma_2(S)=\|w\|\sqrt{\lambda_2}$$

The affinity between the two vectors y and w is now defined to be $$\text{affinity} = 1 - \frac{\sigma_2(S)}{\sigma_1(S)} \quad (10)$$

$$= 1 - \frac{\sqrt{\lambda_2}}{\sqrt{\lambda_1}}$$

$$= 1 - \sqrt{\frac{1+\alpha^2 - \sqrt{(1+\alpha^2)^2 - 4\alpha^2(1-\beta^2)}}{1+\alpha^2 + \sqrt{(1+\alpha^2)^2 - 4\alpha^2(1-\beta^2)}}}$$

Figure 3:
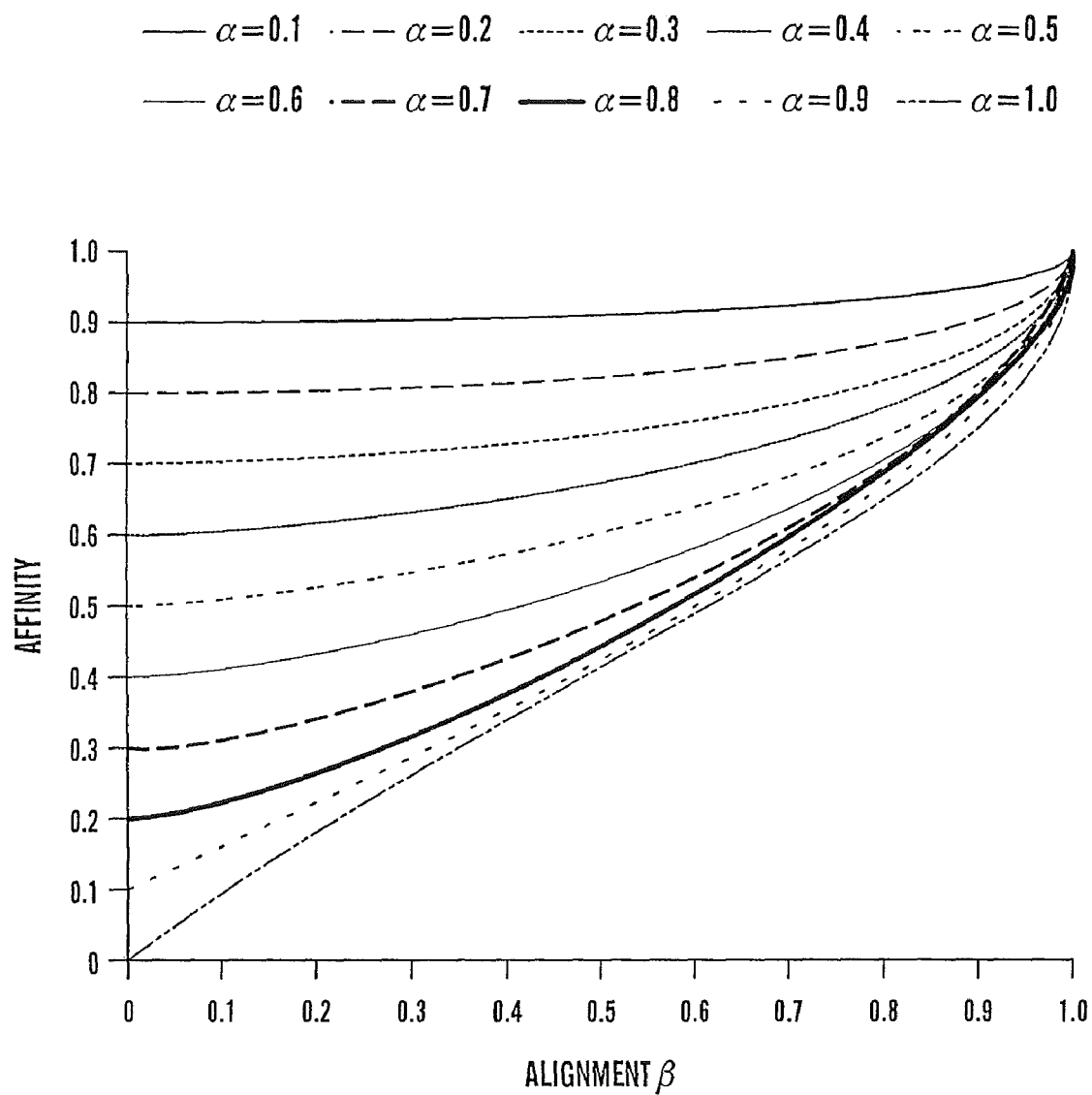
FIG. 3 is a plot of affinity versus alignment for different values of norm-ratio, in accordance with embodiments of the present invention.

Using Equation (10), FIG. 3 shows the plot of affinity versus the alignment $\beta$ for several values of the norm-ratio $\alpha$. From Equation (10), the affinity is a real number between 0 and 1. For each of the curves of FIG. 3, the affinity at $\beta=1$ (i.e., perfect alignment between y and w) is 1 while the affinity at $\beta=0$ (i.e., y and w are orthogonal to each other) is $1-\alpha$. The affinity is a monotonically increasing function of the alignment $\beta$ for a fixed norm-ratio $\alpha$. The closer the affinity is to 1, the better is the quality of the cluster obtained by putting y in the same cluster as w. An affinity close to 0 means y and w should be in different clusters. This explains the clustering algorithm depicted in FIG. 4 for clustering the n columns of a given m×n matrix A into p parts, assuming $2\leq p<n$ ($n\geq 3$).

Figure 4:
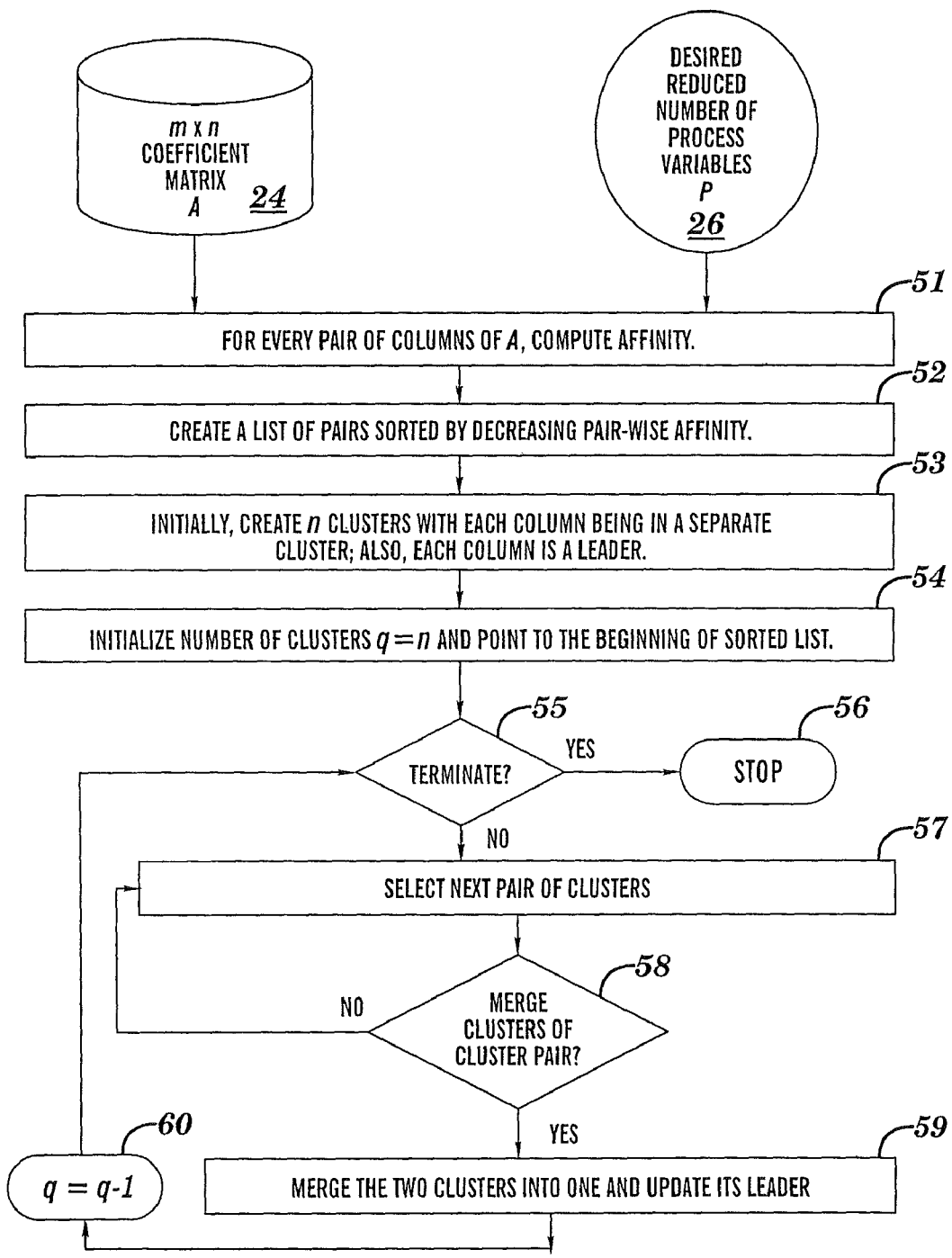
FIG. 4 is a flow chart describing the matrix partitioning of FIG. 2, in accordance with embodiments of the present invention.

In FIG. 4, the input to the algorithm comprises the coefficient matrix A (denoted as reference numeral 24) and specification of the reduced number p of independent process variables (denoted as reference numeral 26). Note that the matrix A is provided in a memory device of a computer system such as the computer system 90 of FIG. 5 discussed infra. A means for providing the matrix A in the memory device may include, inter alia, reading the matrix A into the memory device.

The algorithm depicted in FIG. 4 comprises steps 51-60.

Step 51 computes the norm-ratio $\alpha$, alignment $\beta$, and the affinity, using Equations (8), (9), and (10) for each pair of columns in the coefficient matrix A.

Step 52 sorts the column pairs in decreasing order of affinity.

Step 53 creates a list of clusters comprising n initial clusters such that each of the n initial clusters is a unique column of the coefficient matrix A. Generally, a cluster includes one or more columns of the coefficient matrix A as will be seen infra through the cluster merging step 59. Each cluster has a "leader" which is the column having the largest norm of all of the columns in the cluster. Thus initially, every column of the coefficient matrix A is both a cluster and a leader of the cluster, and the initial number of clusters is equal to n. Note that the affinity between two clusters is defined as the affinity between the leaders of the two clusters.

Step 54 initializes a cluster count index q to n (i.e., q=n initially).

Step 55 determines whether to terminate the clustering algorithm based on satisfaction of a termination condition. In one embodiment, the termination condition is that the number of clusters formed thus far (q) is equal to the desired number of reduced independent process variables (p). Alternative termination conditions will be discussed infra. If YES (i.e., q=p) then the process STOPs in step 56. If NO (i.e., q>p) then step 57 is next executed.

Step 57 selects a next pair of clusters having an affinity therebetween (i.e., between the two clusters of the next pair of clusters) not less than an affinity between clusters of any existing pair of clusters not yet selected from the list of clusters. During the first execution of step 57, the existing clusters in the list of clusters each consist of a single column as explained supra in conjunction with step 53, so that the next pair of clusters is selected from the sorted list of column pairs. It should be recalled from step 52 that the column pairs are positioned in the sorted list of column pairs in order of decreasing value of affinity, so the first column pair picked has the highest affinity; the second column pair to be picked has the second highest affinity, etc.

The pair of clusters selected in step 57 consists of two clusters, namely a first cluster and a second cluster. Step 58 determines, for the cluster pair picked in step 57, whether to merge the first cluster with the second cluster to form a new cluster. During the first execution of step 58, the first and second clusters of the cluster pair selected in step 57 respectively consist of a first column and a second column as explained supra in conjunction with step 53, and step 58 determines whether the first column and the second column from the column pair are each in a separate cluster (i.e., whether the first and second clusters are different clusters), and if so whether the first and second columns are leaders of the first and second clusters, respectively. If the first column and second columns are in the same cluster already or if either the first or second column is not a leader currently of its cluster, then the procedure returns to step 57 to select the next pair of clusters. Otherwise, step 59 is next executed.

Step 59 merges the first and second clusters to form a new cluster. Let $N_1$ and $N_2$ represent the norm of the leader of the first and second clusters, respectively. The leader of the new cluster is the leader ($L_1$) of the first cluster if $N_1 > N_2$ or the leader of the new cluster is the leader ($L_2$) of the second cluster if $N_2 > N_1$. If $N_1 = N_2$ then either $L_1$ or $L_2$ could be the leader of the new cluster, using an arbitrary choice of $L_1$ or $L_2$, or a random selection of $L_1$ or $L_2$. The new cluster thus formed is added to the list of clusters and the first and second clusters are removed from the list of clusters.

In an embodiment, the merging of the first and second clusters to form the new cluster in step 59 removes the first and second clusters as individual clusters for subsequent consideration in the partitioning of the columns of the matrix A. This also removes any non-leader column pair in the list of column pairs of step 52, wherein said any non-leader column pair includes any column of the merged first and second clusters that is not the leader of the merged cluster. Thus in this embodiment, step 58 is unnecessary since the conditions for not merging the clusters of the selected cluster pair appear cannot be satisfied; i.e., the first and second columns will always be a leader in the case of a cluster consisting of more than one column, and the first and second clusters of the cluster pair must be in different clusters due to said removal of column pairs in the list of cluster pairs. Hence in this embodiment, each pair of clusters selected in step 57 will be merged to form a new cluster in step 59.

The procedure next executes step 60, which decrements the cluster count index q by 1, inasmuch as two clusters have been merged into a single cluster (i.e., the new cluster in step 59). The procedure next returns to step 55.

Note that the particular clusters formed by the process of FIG. 4 may consist of merged clusters and unmerged clusters. The merged clusters are formed in step 59. The unmerged clusters (if any) consist of any clusters of the initially formed n clusters in step 53 that have not been merged in step 59. As an example, consider an example of n=5 and p=3, wherein the group of clusters formed by the affinity-based process of FIG. 4 results in the formation of three clusters consisting of a first cluster of columns 2 and 5 (a merged cluster), a second cluster of columns 3 and 4 (a merged cluster), and a third cluster of column 1 (an unmerged cluster). Of course, many other clusters of the matrix A also exist but are not selected in the affinity-based procedure (e.g., a cluster consisting of columns 1 and 3, a cluster consisting of columns 2-5, a cluster consisting of column 2, etc.).

Consider the following numerical example to illustrate the clustering technique of the present invention, using the following 6×4 matrix A such that m=6 and n=4:

$$A = \begin{bmatrix} 9 & 7 & 8 & 6 \\ 9 & -7 & 8 & -6 \\ 9 & 7 & 8 & 6 \\ 9 & -7 & 8 & -6 \\ 9 & 7 & 8 & 6 \\ 9 & -7 & 8 & -6 \end{bmatrix} \quad (11)$$

Note that A is a 6×4 matrix with n=4 columns and m=6 rows. It is desired to reduce the number of process variables to 2 so that the procedure will attempt to reduce the initial n=4 clusters to p=2 clusters. First, a list is constructed of all 6 possible pairs of columns sorted in decreasing order of their pair-wise affinity (see step 52 of FIG. 4) as shown in Table 1.

TABLE 1

| Column Pair | β | α | Affinity |
|---|---|---|---|
| (1, 3) | 1 | 8/9 | 1 |
| (2, 4) | 1 | 6/7 | 1 |
| (1, 4) | 0 | 6/9 | 1/3 |
| (3, 4) | 0 | 6/8 | 1/4 |
| (1, 2) | 0 | 7/9 | 2/9 |
| (2, 3) | 0 | 7/8 | 1/8 |

Table 1 shows that column pairs (1,3) and (2,4) are each perfectly aligned (i.e., β=1). This results in an affinity of 1 for these two pairs irrespective of their norm-ratios (α's). Hence, these two pairs come out at the top of the sorted list of column pairs. The remaining pairs are orthogonal (i.e., β=0) resulting in their affinity being 1−α, and hence appear at the bottom of the sorted list. Initially, there are 4 clusters (i.e., q=4 initially in accordance with step 54 of FIG. 4), and each column is in its own cluster and is the leader of its cluster (see step 53 of FIG. 4).

Since initially q≠p (i.e., 4≠2), the first pair (1,3) in the sorted list is selected (see steps 55 and 57 of FIG. 4). Both columns 1 and 3 are currently in different clusters and leaders of their respective clusters, which leads to the "YES" result of decision step 58 of FIG. 4. Therefore step 59 of FIG. 4 merges columns 1 and 3 into a single new cluster {1,3} and marks column 1 as the leader of the new cluster, since column 1 has a larger norm than the norm of column 3.

Next, step 60 of FIG. 4 decrements the cluster counter q to q=3. The next pair in Table 1, which is (2,4), is selected (see step 57 of FIG. 4) and both columns 2 and 4 are currently in different clusters and leaders of their respective clusters. Therefore columns 2 and 4 are merged into a single new cluster {2,4} and column 2 is marked as its leader (since column 2 has the larger norm), in accordance with steps 57-58 of FIG. 4. The cluster counter q is decremented to q=2 (see step 60 of FIG. 4) which matches the number p=2, thereby satisfying the STOP condition (i.e., q=p) of step 55 of FIG. 4, resulting in a final cluster set of {1,3} and {2,4}. This final clustering results in the following clusters of the original A:

$$A_{(1)} = \begin{bmatrix} 9 & 8 \\ 9 & 8 \\ 9 & 8 \\ 9 & 8 \\ 9 & 8 \\ 9 & 8 \end{bmatrix}, A_{(2)} = \begin{bmatrix} 7 & 6 \\ -7 & -6 \\ 7 & 6 \\ -7 & -6 \\ 7 & 6 \\ -7 & -6 \end{bmatrix}$$

Since each cluster has only two columns, it follows that:

$$A_{(1)}^T A_{(1)} = \begin{bmatrix} 9 & 9 & 9 & 9 & 9 & 9 \\ 8 & 8 & 8 & 8 & 8 & 8 \end{bmatrix} \begin{bmatrix} 9 & 8 \\ 9 & 8 \\ 9 & 8 \\ 9 & 8 \\ 9 & 8 \\ 9 & 8 \end{bmatrix} = \begin{bmatrix} 486 & 432 \\ 432 & 384 \end{bmatrix} \quad (12)$$

$$A_{(2)}^T A_{(2)} = \begin{bmatrix} 7 & -7 & 7 & -7 & 7 & -7 \\ 6 & -6 & 6 & -6 & 6 & -6 \end{bmatrix} \begin{bmatrix} 7 & 6 \\ -7 & -6 \\ 7 & 6 \\ -7 & -6 \\ 7 & 6 \\ -7 & -6 \end{bmatrix} = \begin{bmatrix} 294 & 252 \\ 252 & 216 \end{bmatrix} \quad (13)$$

The eigen-values of the above 2×2 matrices are 870 and 0 for the matrix of Equation (12) and 510 and 0 for the matrix of Equation (13). Therefore, the singular values of the two clusters are:

$\sigma_{(1),1} = \sqrt{870} = 29.495762, \sigma_{(1),2} = 0$ $\sigma_{(2),1} = \sqrt{510} = 22.583180, \sigma_{(2),2} = 0$ Thus, according to Equation (7), the approximation error E for this particular choice of clustering is 0, which means that this is the best cluster partitioning for p=2 for this example.

The corresponding left singular vector $u_{(k),1}$ and the right singular vector $v_{(k),1}$ of the k-th cluster $A_{(k)}$ for the largest singular values are calculated as follows. The left singular vector $u_{(k),1}$ is an m-component vector computed as being proportional to the leader of $A_{(k)}$. The right singular vector $v_{(k),1}$ is a 2-component vector whose first element is proportional to the average value of the leader of $A_{(k)}$. Both $u_{(k),1}$ and $v_{(k),1}$ are renormalized to a unit norm. Thus, for this example:

$$u_{(1),1} = \frac{1}{\sqrt{6}} \begin{bmatrix} 1 \\ 1 \\ 1 \\ 1 \\ 1 \\ 1 \end{bmatrix} = \begin{bmatrix} 0.4082 \\ 0.4082 \\ 0.4082 \\ 0.4082 \\ 0.4082 \\ 0.4082 \end{bmatrix}, v_{(1),1} = \frac{1}{\sqrt{9^2+8^2}} \begin{bmatrix} 9 \\ 8 \end{bmatrix} = \begin{bmatrix} 0.7474 \\ 0.6644 \end{bmatrix}$$

$$u_{(2),1} = \frac{1}{\sqrt{6}} \begin{bmatrix} 1 \\ -1 \\ 1 \\ -1 \\ 1 \\ -1 \end{bmatrix} = \begin{bmatrix} 0.4082 \\ -0.4082 \\ 0.4082 \\ -0.4082 \\ 0.4082 \\ -0.4082 \end{bmatrix},$$

$$v_{(2),1} = \frac{1}{\sqrt{7^2+6^2}} \begin{bmatrix} 7 \\ 6 \end{bmatrix} = \begin{bmatrix} 0.7593 \\ 0.6508 \end{bmatrix}$$

Using Equation (5), the two columns $b_1$ and $b_2$ of the new coefficient matrix B are:

$$b_1 = \sigma_{(1),1} u_{(1),1} = \sqrt{145} \begin{bmatrix} 1 \\ 1 \\ 1 \\ 1 \\ 1 \\ 1 \end{bmatrix} = \begin{bmatrix} 12.0416 \\ 12.0416 \\ 12.0416 \\ 12.0416 \\ 12.0416 \\ 12.0416 \end{bmatrix} \text{ and}$$

$$b_2 = \sigma_{(2),1} u_{(2),1} = \sqrt{85} \begin{bmatrix} 1 \\ -1 \\ 1 \\ -1 \\ 1 \\ -1 \end{bmatrix} = \begin{bmatrix} 9.2195 \\ -9.2195 \\ 9.2195 \\ -9.2195 \\ 9.2195 \\ -9.2195 \end{bmatrix}$$

Using the computed values of $b_1$ and $b_2$, the new coefficient matrix B is:

$$B = \begin{bmatrix} 12.0416 & 9.2195 \\ 12.0416 & -9.2195 \\ 12.0416 & 9.2195 \\ 12.0416 & -9.2195 \\ 12.0416 & 9.2195 \\ 12.0416 & -9.2195 \end{bmatrix}$$

Using Equation (6), the new process variables $z_1$ and $z_2$ are:

$z_1 = v_{(1),1}^T x_{(1)} = 0.7474 x_1 + 0.6644 x_3$ $z_2 = v_{(2),1}^T x_{(2)} = 0.7593 x_2 + 0.6508 x_4$

In an embodiment, the desired number of clusters p is supplied as an input to the algorithm of FIG. 4. In this embodiment the termination condition in step 55 of FIG. 4 may be q=p wherein q is the cluster count index.

In a first alternative embodiment, the above affinity-based clustering algorithm stops when the affinity in the current pair of columns from the sorted list falls below an affinity threshold. The affinity threshold may be supplied as an input to the algorithm. If the affinity of the next pair of clusters selected in the selecting step 57 of FIG. 4 is less than the affinity threshold, then a flag may be set indicating that the termination condition has been satisfied, followed by re-executing step 55 while not executing steps 57-60. This first alternative embodiment will prevent clustering of columns with poor affinity. The number of clusters produced by this first alternative embodiment may be more than the desired number p specified. Alternatively p need not be specified as input for this first alternative embodiment, resulting in a smallest computed value of p such that the affinity in each cluster of the final set of clusters exceeds the affinity threshold.

In a second alternative embodiment, an error tolerance $\epsilon$ could be specified and the algorithm could be modified to generate the smallest number of clusters p for which the cluster approximation error E according to Equation (7) is less than the error tolerance $\epsilon$. The error tolerance $\epsilon$ may be supplied as an input to the algorithm. If the selecting step 57 of FIG. 4 results in list of clusters having a cluster approximation error E such that $E \geq \epsilon$, then a flag may be set indicating that the termination condition has been satisfied, followed by re-executing step 55 while not executing steps 57-60.

In a third alternative embodiment employing a hybrid procedure, assume that it is desired to partition a matrix H having N columns. In this hybrid procedure, n columns of the N columns are partitioned into p clusters by the affinity-based clustering of the present invention, and the j columns of the N columns are partitioned into t clusters by another method (e.g., standard SVD), wherein n+j=N. Values of p and t could be independent inputs. Alternatively, p+t could be an input, wherein p and t could be determined via any desired criterion such as, inter alia, a criterion of p/t=n/j, i.e., the partition sizes are proportional to the number of columns of the partitions in the original matrix, to the nearest integer. As an example of this hybrid procedure, the n columns could be associated with an independent set of process variables $x_i$ (i=1, 2, . . . , n) having non-gaussian sources of variation, and the j columns could be associated with j additional process variable $w_k$ (k=1, 2, . . . , j) having gaussian sources of variation. The combined reduced set of p+t process variables resulting from this hybrid procedure would be statistically independent. This hybrid procedure could be expanded such that n+j<N so that the remaining N−n−j columns of the N columns are independently partitioned into one or more additional partitions of clusters. Each additional partition of clusters may be generated by any desired method that preserves the statistical independence of the final reduced set of process variables.

In summary, the affinity-based clustering of the present invention comprises partitioning the n columns of the matrix A into a closed group of p clusters, p being a positive integer of at least 2 and less than n, said partitioning comprising an affinity-based merging of clusters of the matrix A. The following discussion clarifies the meaning of "affinity-based merging" of clusters of the matrix A. Said affinity-based merging of clusters of the matrix A considers all candidate clusters of the matrix A which may be merged pairwise, and determines or provides the affinity between the clusters of each such pair of candidate clusters ("pairwise" affinities). Then the affinity-based merging selects a pair of such candidate clusters to be merged based on comparing the pairwise affinities so determined or provided. In an embodiment described supra, the selected pair of candidate clusters was selected because it had a higher affinity than any other pair of candidate clusters.

Although the inventive affinity-based clustering described herein may be advantageously applied to path-based statistical timing analysis relating to semiconductor chip timing, the affinity-based clustering of the present invention may be generally used to reduce the number of degrees of freedom (i.e., dimensionality) used in any linear model. For various modeling, optimization, and analysis purposes, it may be beneficial to produce models of reduced dimensionality to capture the system behavior as a function of a smaller number of sources of variation. Thus, the inventive method may be used in many other domains such as, inter alia, mechanical or thermal design. As an example, the performance (such as vibration, gas mileage, stability or braking effectiveness, etc.) of a vehicle or airplane or helicopter can be modeled as a function of a number of sources of variation such as machining tolerances, material properties, temperature, etc. As another example, a stochastic model of the power dissipation of sub-circuits of an integrated circuit can be constructed as a function of temperature, device characteristics, input signals, chip activity, etc, and a reduced-dimensionality model can be constructed by the inventive method and applied in simulation, analysis, optimization or macromodeling of the power dissipation.

Figure 5:
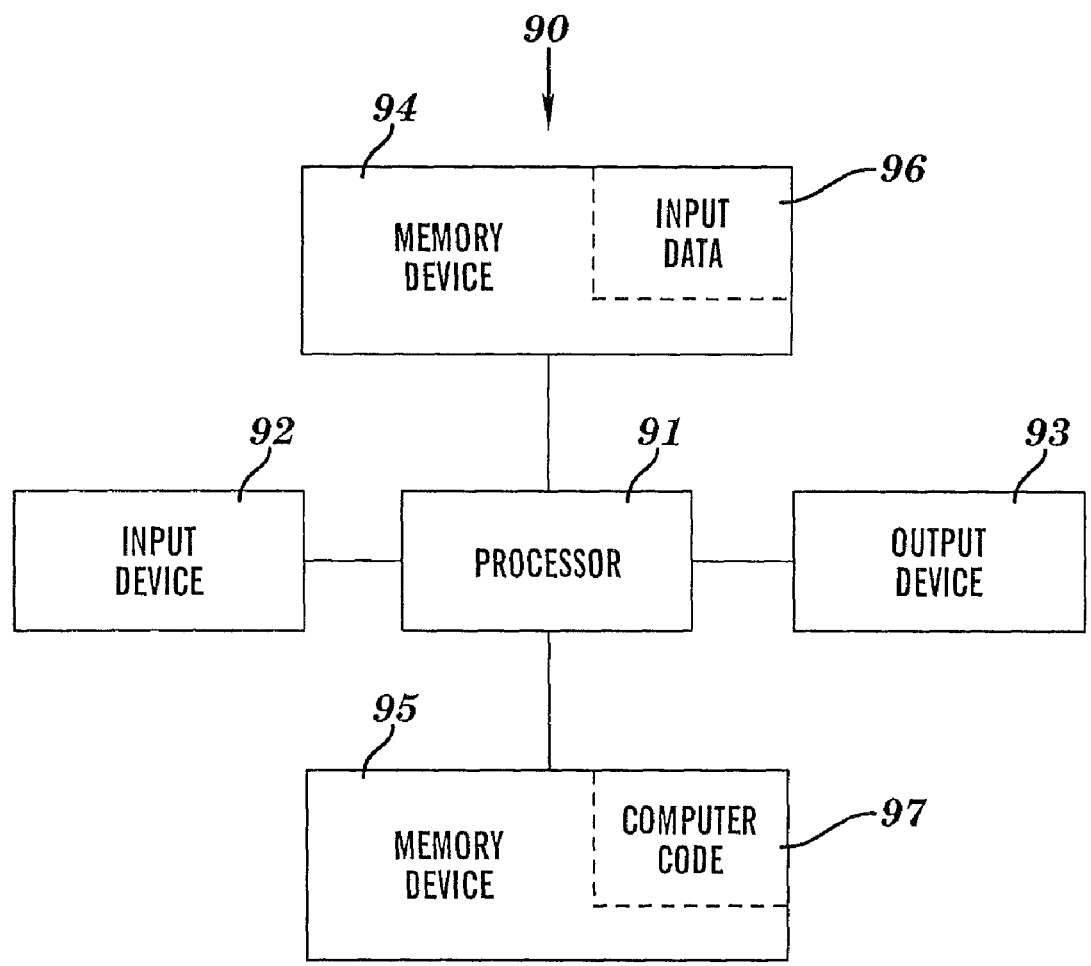
FIG. 5 illustrates a computer system used for affinity-based clustering of vectors for partitioning the columns of a matrix, in accordance with embodiments of the present invention

FIG. 5 illustrates a computer system 90 used for affinity-based clustering of vectors for partitioning the columns of a matrix, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for affinity-based clustering of vectors for partitioning the columns of a matrix. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 5) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 5 shows the computer system 90 as a particular configuration of hardware and software, any configuration of hardware and software, as would be known to a person of ordinary skill in the art, may be utilized for the purposes stated supra in conjunction with the particular computer system 90 of FIG. 5. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

REFERENCES

[1] J. A. G. Jess, K. Kalafala, S. R. Naidu, R. H. J. M. Otten, and C. Visweswariah, "Statistical timing for parametric yield prediction of digital integrated circuits," *Proceedings of the* 40*th Design Automation Conference*, Anaheim, Calif. (June 2003), pages 932-937.

[2] Z. Li, X. Lu, and W. Shi, "Process Variation Dimension Reduction Based on SVD," *Proceedings of the IEEE International Symposium on Circuits and Systems*, Bangkok, Thailand (May 2003), Volume IV, pages 672-675.

[3] G. H. Golub and C. F. Van Loan, *Matrix Computations*, The John Hopkins University Press, (1987).

[4] M. Abramowitz and I. A. Stegun, *Handbook of Mathematical Functions*, page 824, New York: Dover Publications, Inc. (1972).

What is claimed is:

1. A method of partitioning the columns of a matrix A, said method comprising:

providing the matrix A in a memory device of a computer system, said matrix A having n columns and m rows, n being an integer of at least 3, m being an integer of at least 1;

executing an algorithm by a processor of the computer system, said executing including partitioning the n columns of the matrix A into a closed group of p clusters, p being a positive integer of at least 2 and less than n, said partitioning comprising an affinity-based merging of clusters of pairs of clusters of the matrix A based on an affinity between the clusters in each pair of clusters being merged, each said cluster consisting of one or more columns of said matrix A; and storing the p clusters in a computer-readable physically tangible storage device.

2. The method of claim 1, said executing further including accepting p as an input to the algorithm.

3. The method of claim 1, wherein the matrix A relates a vector x having n elements to a vector d having m elements in accordance with an equation of d=Ax, wherein the n elements of the vector x consist of n statistically independent variables, and wherein the m elements of the vector d consist of m dependent variables.

4. The method of claim 3, said executing further including after said partitioning:
computing a vector z having p statistically independent elements such that each of the p statistically independent elements is a linear combination of the n statistically independent variables; and
computing an m×p matrix B from the p clusters of the matrix A such that Bz defines a new set of m dependent variables replacing Ax.

5. The method of claim 3, said n statistically independent variables representing non-gaussian sources of variation.

6. The method of claim 5, said executing further including selecting the n statistically independent variables from N statistically independent variables such that N>n, said N variables consisting of said n variables and a remaining N−n statistically independent variables, said N−n variables representing gaussian sources of variation.

7. The method of claim 3, said m elements of the vector d denoting path slack variations in a semiconductor chip, said n statistically independent variables denoting sources of statistical error that linearly contribute to said path slack variations.

8. The method of claim 7, said sources of statistical error comprising statistical variations selected from the group consisting of statistical variations associated with processing the semiconductor chip, statistical variations associated with manufacturing the semiconductor chip, statistical variations associated with operating the semiconductor chip, statistical variations associated with modeling the semiconductor chip, and statistical variations associated with uncertainties in material properties of the semiconductor chip.

9. A method of partitioning the columns of a matrix A, said method comprising executing an algorithm by a processor of a computer system, said executing including performing the steps of:
generating a list of clusters having n clusters such that each of the n clusters consist of a unique column of the matrix A, said matrix A being stored in a memory device of the computer system, said matrix A having n columns and m rows, n being an integer of at least 3, m being an integer of at least 1, each said cluster consisting of one or more columns of said matrix A;
determining if a termination condition is satisfied and if said determining so determines that said termination condition is satisfied then terminating said executing else performing the following steps:
selecting a next pair of clusters from the list of clusters, said next pair of clusters consisting of a first cluster and a second cluster, said next pair of clusters having an affinity that is not less than an affinity between any pair of clusters not yet selected from the list of clusters;
merging the first and second clusters to form a new cluster;
inserting the new cluster into the list of clusters while removing the first and second clusters from the list of clusters; and
re-executing said determining step,
storing the list of clusters comprising all of said inserted new clusters in a computer-readable physically tangible storage device.

10. The method of claim 9, said executing further including performing the step of accepting an input p to the algorithm, p being a positive integer of at least 2 and less than n, said termination condition being that a current number of clusters in the list of clusters is equal top.

11. The method of claim 9, said executing further including performing the steps of:
accepting an affinity threshold as an input to the algorithm; and
if the affinity of the next pair of clusters selected in the selecting step is less than the affinity threshold then setting a flag indicating that the termination condition has been satisfied and again performing the determining step while not performing the inserting step.

12. The method of claim 9, said executing further including performing the steps of:
supplying a cluster error tolerance $\epsilon$ as an input to the algorithm; and
if the selecting step results in the list of clusters having a cluster approximation error E such that $E \geq \epsilon$ then setting a flag indicating that the termination condition has been satisfied and again performing the determining step while not performing the inserting step.

13. The method of claim 9, wherein the matrix A relates a vector x having n elements to a vector d having m elements in accordance with an equation of d=Ax, wherein the n elements of the vector x consist of n statistically independent variables, and wherein the m elements of the vector d consist of m dependent variables.

14. The method of claim 13, said executing further including performing the steps of:
computing a vector z having p statistically independent elements such that each of the p statistically independent elements is a linear combination of the n statistically independent variables; and
computing an m×p matrix B from the p clusters of the matrix A such that Bz defines a new set of m dependent variables replacing Ax.

15. The method of claim 13, said n statistically independent variables representing non-gaussian sources of variation.

16. The method of claim 15, said executing further including performing the step of selecting the n statistically independent variables from N statistically independent variables such that N>n, said N variables consisting of said n variables and a remaining N−n statistically independent variables, said N−n variables representing gaussian sources of variation.

17. The method of claim 13, said m elements of the vector d denoting path slack variations in a semiconductor chip, said n statistically independent variables denoting sources of statistical error that linearly contribute to said path slack variations.

18. The method of claim 17, said sources of statistical error comprising statistical variations selected from the group consisting of statistical variations associated with processing the semiconductor chip, statistical variations associated with manufacturing the semiconductor chip, statistical variations associated with operating the semiconductor chip, statistical variations associated with modeling the semiconductor chip, and statistical variations associated with uncertainties in material properties of the semiconductor chip.

* * * * *